United States Patent
Czaja et al.

(10) Patent No.: US 6,356,595 B1
(45) Date of Patent: Mar. 12, 2002

(54) METHOD AND APPARATUS FOR DECODING CONTINUOUSLY CODED CONVOLUTIONALLY ENCODED MESSAGES

(75) Inventors: Stash Czaja, Cardiff; Sanguoon Chung; Xiaojun Li, both of San Diego, all of CA (US)

(73) Assignees: Sony Corporation, Tokyo (JP); Sony Electronics, Inc., Park Ridge, NJ (US)

( * ) Notice: Subject to any disclaimer, the term of this patent is extended or adjusted under 35 U.S.C. 154(b) by 0 days.

(21) Appl. No.: 09/095,614

(22) Filed: Jun. 10, 1998

Related U.S. Application Data (60) Provisional application No. 60/061,898, filed on Oct. 14, 1997.

(51) Int. Cl.[7] ................................................. H03D 1/00
(52) U.S. Cl. ........................ 375/262; 375/341; 714/794
(58) Field of Search ................................. 375/262, 341; 714/794, 795, 796, 786

(56) References Cited

U.S. PATENT DOCUMENTS

| | | | | |
|---|---|---|---|---|
| 5,161,194 A | * | 11/1992 | Ujiie ........................... | 370/316 |
| 5,229,767 A | * | 7/1993 | Winter et al. ............... | 714/795 |
| 5,267,261 A | * | 11/1993 | Blakeney, II et al. ....... | 370/332 |
| 5,416,787 A | * | 5/1995 | Kodama et al. ............. | 714/795 |

* cited by examiner

*Primary Examiner*—Temesghen Ghebretinsae
*Assistant Examiner*—Kevin M Burd
(74) *Attorney, Agent, or Firm*—Frommer Lawrence & Haug LLP; William S. Frommer; Glenn F. Savit

(57) ABSTRACT

A decoding method for use in a communications system employing a communication channel in which a message is convolutionally encoded by a base station encoder and transmitted to a remote terminal during a time slot allocated to at least that remote terminal. The encoder is not completely reset immediately prior to the allocated time slot such the encoder state is unknown at the onset thereof. The decoding method includes assigning a most likelihood probability for an initial encoder state as being one of a number of predetermined encoder states; and, convolutionally decoding ensuing bits of the message based on the assumption of the initial encoder state as one of the predetermined states. The method affords low error rate decoding, and allows for improved power conservation by a mobile station, since the mobile station need not awaken significantly prior to its allocated time slot. Preferably, a Viterbi decoder is used to perform the convolutional decoding. The method has particular utility when used for decoding page messages indicative of call notifications in a paging channel of a code division multiple access (CDMA) wireless telecommunications system.

20 Claims, 5 Drawing Sheets

METHOD AND APPARATUS FOR DECODING CONTINUOUSLY CODED CONVOLUTIONALLY ENCODED MESSAGES

This application claims benefit of provisional application Ser. No. 67/067,898, filed Oct. 14, 1997.

FIELD OF THE INVENTION

The present invention relates generally to communications systems, and more particularly, to decoding convolutionally encoded messages such as paging messages transmitted within a code division multiple access (CDMA) wireless telecommunications system.

BACKGROUND OF THE INVENTION

Currently, standard protocols for CDMA wireless telecommunications define requirements for various communication channels, including paging and access channels, traffic channels and synchronization channels. A paging channel is used by a base station to communicate to mobile stations (radiotelephones) when they are not already assigned to a traffic channel. The primary purpose of the paging channel is to convey pages, i.e., notifications of incoming calls, to the mobile stations.

The mobile station operates in an idle mode while awaiting notification of an incoming call over the paging channel. Typically, to conserve power in the idle mode and thereby prolong battery life, the mobile station operates in a slotted mode, in which the mobile station periodically activates its receiver electronics to "listen" for a page during a periodic time slot allocated to at least that mobile station. If no page intended for that mobile station is received during the allocated time slot, the mobile station "goes to sleep", essentially turning off its components and conserving power, until it reactivates itself for the next assigned slot. In general, the percentage of time that the mobile station is allowed to sleep in the idle mode is proportional to the power conservation.

In accordance with the TIA-IS-95-A standard, which governs CDMA wireless communications in the United States, paging messages are convolutionally encoded in the paging channel. This technique reduces the likelihood of errors upon reception of the message due to multipath fading, noise or other factors. Such convolutional encoding involves sequencing an original data stream through a shift register and summing the bits of predetermined stages of the shift register to generate a larger number of bits for transmission. Mobile stations are permitted to operate either in a slotted mode as mentioned above to receive synchronized pages, or in a non-slotted mode to receive unsynchronized or synchronized pages. The pages transmitted by the base station are of variable length, up to 80 ms in duration. At the mobile station, decoding of the page message is preferably performed with a Viterbi decoder.

In the slotted mode, to demodulate and decode the message contained within its allocated time slot, the mobile station "wakes up" one frame ahead of time to synchronize the Viterbi decoder within the mobile station. This early wake-up is necessary because the paging messages are continuously encoded (i.e., the base station encoder shift register is not reset in between page messages) and the decoder has no knowledge of the initial encoder state at the start of the allocated slot. Usually, the decoder requires at least a 13-bit transition to synchronize; however, since the transmitted message is interleaved over a 20 ms frame, the synchronization takes 20 ms. For most cases, there is no message transmitted to a particular mobile station, which then goes back into the sleep mode. As such, each time the mobile station does not receive a message, it spends 40 ms in the active mode, i.e., 20 ms for the wake-up period and 20 ms thereafter in its allocated slot attempting to receive a message. This represents twice as much time in the active mode as necessary (40 ms vs. 20 ms), thus significantly reducing the mobile station's idle time capacity.

Recently, a method for improving power conservation in mobile stations operating in the idle mode in accordance with the IS-95 requirements has been proposed. The method involves at least partially flushing (i.e., partially resetting) the encoder just prior to the onset of a synchronized paging slot, by inserting at least four padding bits (e.g., four zeroes) immediately prior to the onset of the synchronized page message. For base station encoders in accordance with the IS-95 standard, an 8-bit encoder register is employed such that nine (K-1) consecutive known padding bits are necessary to reset the encoder to a known state. The method takes advantage of the fact that, due to the variability in the length of the previous message, padding bits are usually added to the end of the message anyway in accordance with the standard. The method then assumes that the initial encoder state at the onset of the allocated time slot is all zeroes (eight zeroes) since, by guaranteeing at least four zeroes, there will be more zeroes at the tail end of the previous slot most of the time. The Viterbi decoding process would then proceed based on the assumption of an all zeroes state. Consequently, the Viterbi decoder need not be turned on one frame early to synchronize, thereby conserving power. A shortcoming of this approach, however, is that the assumption of the encoder being in an all zeroes state with only four consecutive zeroes guaranteed is not valid in most cases. Indeed, simulations have shown that the message error probability with this approach is unacceptably in the range of 15 to 25%.

SUMMARY AND OBJECTS OF THE INVENTION

It is, therefore, an object of the present invention to provide an improved decoder for decoding a message transmitted in a channel in which continuous convolutionally encoded messages are transmitted without an encoder reset operation between messages.

It is another object of the present invention to improve power consumption of mobile stations during idle mode operation, while providing low message error probability.

It is a further object of the invention to advance the state of the art of wireless mobile stations.

In an illustrative embodiment of the invention, there is provided a decoding method for use in a communications system employing a communication channel in which a message is convolutionally encoded by a base station encoder and transmitted to a remote terminal during a time slot allocated to at least that remote terminal. The encoder is not completely reset immediately prior to the allocated time slot such that the encoder is in an unknown state at the onset thereof. The decoding method includes the steps of assigning a most likelihood probability for an initial encoder state to a number of predetermined encoder states; and, convolutionally decoding succeeding bits of the message based on an assumption that the initial encoder state is one of the predetermined states.

The method has particular utility when used to decode paging channel messages in a CDMA wireless telecommunications system. Preferably, a Viterbi decoder is used to perform the decoding, and the predetermined encoder states assigned a most likelihood probability are sufficient to enable the trellis of the decoder to converge within a small number of transitions, less than the minimum free distance of the code. This technique results in error-free decoding, provided that there are no consecutive bit errors in the communication channel.

The illustrative method and decoders embodying the same beneficially afford low error rate decoding of convolutionally encoded messages without the necessity of resetting the encoder on the transmit side in between messages. The invention can be employed to lower power consumption within a mobile station operating within the slotted mode, since the mobile station need not awaken substantially before the onset of its allocated time slot to synchronize its decoder.

BRIEF DESCRIPTION OF THE DRAWINGS

The following detailed description, given by way of example and not intended to limit the present invention solely thereto, will best be appreciated in conjunction with the accompanying drawings, in which like reference numerals denote like elements and parts, wherein.

DETAILED DESCRIPTION OF CERTAIN PREFERRED EMBODIMENTS

An illustrative embodiment of the invention will now be described in detail with particular reference to decoding messages transmitted within a CDMA paging channel. Although the invention has particular utility for this application, it is not limited thereto. Decoders in accordance with the invention and their method of operation may be employed to decode convolutionally encoded messages transmitted in other wireless or wireline communication systems, such as time domain multiplexed (TDM) and/or frequency division multiplexed (FDM) systems.

Figure 1:
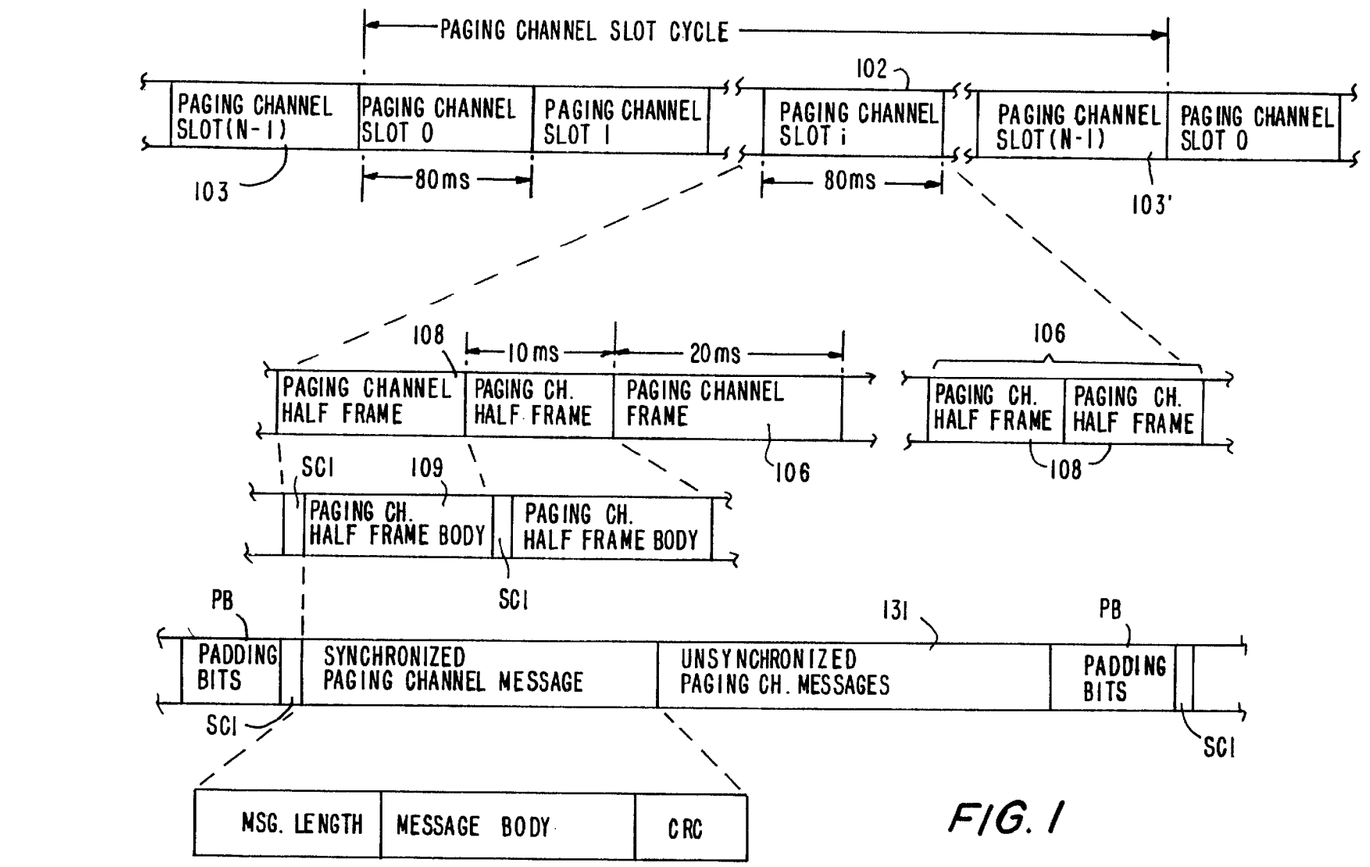
FIG. 1 is a timing diagram illustrating slotted mode paging channel message structure in accordance with an illustrative embodiment of the invention.

Referring now to FIG. 1, a paging channel message structure in accordance with an embodiment of the invention is illustrated. The shown message structure is similar to that required by the IS-95-A standard, but with one key difference—a predetermined sequence of padding bits PB are inserted prior to a Synchronized Capsule Indicator (SCI) bit whenever a synchronized message is to immediately follow. These padding bits are required to implement decoding in accordance with the invention as will be elaborated upon below.

In the illustrative message structure of FIG. 1, a paging channel slot cycle is composed of N paging channel slots (slots 0 to (N−1)), each 80 ms in duration, where N=2,048 in accordance with the standard. Mobile stations can receive pages by operating in either a slotted or non-slotted mode. A mobile station operating in the slotted mode is assigned one periodic paging channel slot. That mobile station will "listen" for a synchronized paging message intended therefor only during the assigned slot, such as by determining whether a transmitted message contains a unique 32-bit electronic serial number (ESN) identifying that mobile station. A mobile station operating in the non-slotted mode may receive a synchronized or unsynchronized paging message transmitted within any slot.

Each paging channel slot such as slot "i" 102 (shown expanded) is composed of four 20 ms long paging channel frames 106, with each frame 106 composed of two paging channel half frames 108, each 10 ms long. A paging channel half frame consists of a single SCI bit and a paging channel half frame body 109. Whenever the base station transmits the SCI bit as a "1", it also transmits a synchronized paging message immediately thereafter, i.e, in the succeeding paging channel half frame body 109. A synchronized message may be followed by one or more unsynchronized messages. If an SCI bit is a "0", no message is transmitted in the succeeding half frame body 109.

It is noted here that the padding bits PB and the SCI bit are inserted in the original data stream, and are convolutionally encoded along with the original data. With the convolutional encoding scheme of this embodiment, each original bit is encoded to produce two output bits to be modulated and transmitted. Hence, when discussing the "transmission" of an SCI bit, a padding bit, or a page message bit, it is understood that the two corresponding encoded bits are transmitted.

A paging channel message, whether synchronized or unsynchronized, is composed of an 8-bit length field $MSG_{13}LENGTH$, a message body field and an error detection field (CRC) of 30 bits. The length field code is determinative of how long the message body field is. Thus, the paging channel messages are of variable length. If, after the end of a synchronized paging channel message there remain eight bits or more before the next SCI bit, the base station may transmit an unsynchronized message 131 immediately following the synchronized message. Contrarily, if there are fewer than eight bits remaining before the next SCI bit, or if no unsynchronized message is transmitted following a paging channel message (synchronized or unsynchronized), then the base station includes sufficient terminal padding bits at the end of that message to extend it through the bit preceding the next SCI bit.

By way of example, if slot (N−1) is assigned to a mobile station operating in the slotted mode, a mobile station in accordance with the invention will power up its receiver electronics just prior to slot (N−1) 103. After the message passes the CRC check, if the first SCI bit in slot 103 is a "1", the mobile station decodes the succeeding synchronized page message to determine whether it contains the electronic serial number (ESN) identifying the same. If the mobile determines the ESN was not transmitted, it powers down its components until just prior to the next slot (N−1) 103', where the process is repeated. If the ESN is received, the mobile station maintains power to its components for further communications in a traffic channel to be assigned by the base station.

As discussed earlier, mobile stations of the prior art power up their receiver/decoder electronics at least one frame ahead of time to synchronize the Viterbi decoder. Hence, if a prior art mobile station were assigned slot (N−1) in the paging channel structure of FIG. 1, it would turn on about 20 ms prior to the onset of slot (N−1) 103, then power down when no message is received, and then power up again approximately 20 ms prior to the onset of slot 103'. In accordance with the presently discussed embodiment of the invention, the mobile station assigned to slot (N−1) does not require any time for synchronizing the Viterbi decoder, and will turn on its electronics immediately prior to the start of slot 103 in this example. (Of course, it will need to turn on a minimum amount of time prior to the commencement of the slot to correctly demodulate the first bit of the slot).

In the present embodiment, whenever a synchronized paging message is to be transmitted immediately after the SCI bit, a predetermined number "$N_B$" of known padding bits PB are convolutionally encoded and transmitted by the base station immediately prior to the SCI bit. These padding bits PB are annexed to whatever bit stream immediately precedes them, as part of the original data stream. In other words, the padding bits PB are shifted into the encoder register to be convolutionally encoded with the original data stream. The bit sequence immediately preceding the padding bits PB may be either the end of a paging message or other padding bits added to the tail end of the previous message. In any case, by guaranteeing that at the very least, the predetermined number of bits PB will immediately precede the SCI bit and the synchronized message, the mobile station's Viterbi decoder can perform error-free decoding based on an unknown encoder state in a manner to be described. The latter error-free decoding is achieved provided that there are no consecutive bit errors (e.g., caused by fading, noise, etc.) between the transmitted and received data, of a length exceeding the code minimum free distance. (If there are consecutive errors of a length exceeding the code minimum free distance, the decoding will be imperfect.) Such error-free decoding is performed without the necessity of synchronizing the Viterbi decoder ahead of time—the decoder may be turned on immediately prior to the time that the first SC bit o f the assigned slot is transmitted.

Briefly, error-free decoding of the page message is accomplished by assigning a maximum likelihood probability to predefined encoder states which are selected in accordance with the predetermined number $N_B$ of padding bits transmitted immediately prior to the message, and the number of encoder register bits. For a convolutional code length of K, the number "$N_{PBS}$" of predefined encoder states of maximum likelihood probability is defined as:

$$N_{PES}=(K-1-N_B)^2 \quad (1).$$

By way of example, if the base station encoder utilizes an 8-bit register (K=9), as in the TIA-IS-95 protocol, four padding bits PB can be utilized (i.e., $N_B$=4), with the decoder assigning sixteen encoder states of most likely probability ($N_{PES}$=16) to achieve error-free decoding.

Of course, if the base station were to always convolutionally encode and transmit a sufficient number of padding bits to completely reset the encoder immediately prior to the SCI bit, then the decoding process could be commenced based on the encoder being in a known state. In the above example with an 8-bit encoder register, this approach would require eight consecutive known padding bits before the SCI bit. In accordance with the present invention, however, the encoder is guaranteed to be only partially reset (partially flushed) whereby it is permissible to transmit less than eight consecutive padding bits for the 8-bit register case. Consequently, more bits of the paging channel are allocated for messages and overhead, thereby providing a more efficient channel.

Figure 2:
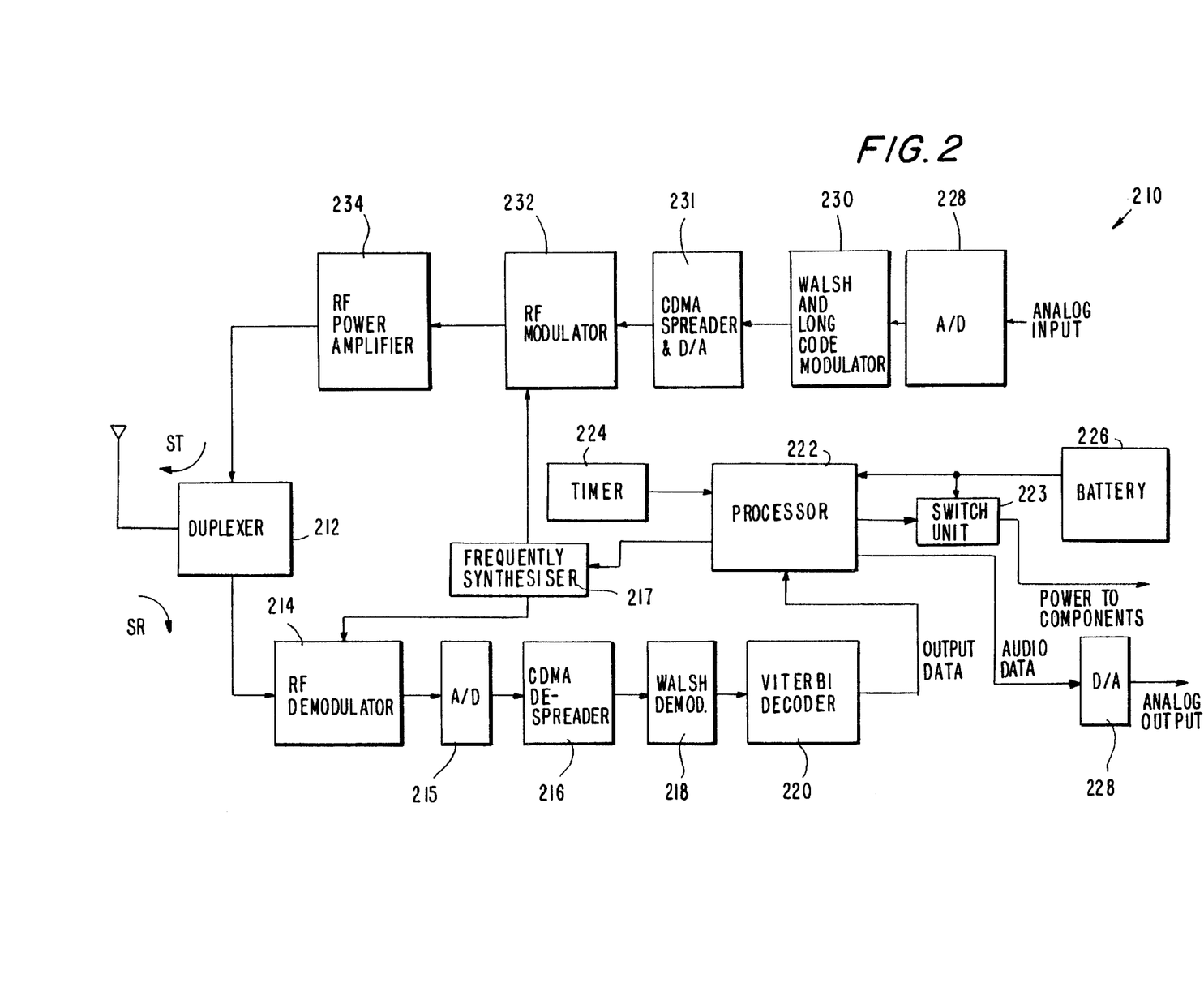
FIG. 2 is a block diagram depicting electronics within a mobile station.

Referring now to FIG. 2, a block diagram of electronics within an illustrative mobile station 210 embodying the invention is shown. A battery 226 supplies power to the various components of the mobile station through a switch unit 223. When operating in the slotted mode awaiting a call, the battery power is periodically switched on and off to the various electronics by processor 222 controlling the switching state of switch unit 223. Processor 222 operates in conjunction with a timer 224 synchronized to the base station clock to periodically "wake up" the processor just before the onset of the assigned paging channel slot. In turn, processor 222 wakes up the receive electronics in sufficient time prior to the start of the assigned slot to enable the initial bits of the slot to be properly received and demodulated.

A paging channel signal $S_R$ (forward signal) transmitted by the base station is received at the mobile station. At the base station, signal $S_R$ is convolutionally encoded, modulated by the Walsh function, and direct spread by a PN sequence. Signal $S_R$ is received and routed through duplexer 212, then down-converted, filtered, phase demodulated and gain controlled (AGC) within RF demodulator 214. A frequency synthesizer 217 operating under the control of processor 222 provides a precise local oscillation frequency to RF demodulator 214 to allow the latter to isolate the frequency components of signal SR during down-conversion and filtering. The RF demodulated output signal is digitized by A/D converter 215, despread by CDMA despreader 216 and then demodulated with a Walsh sequence by Walsh demodulator 218. The Walsh demodulated signal is then decoded by Viterbi decoder 220 which provides decoded output data to processor 222. Processor 222 determines whether the decoded paging message indicates a call notification to the mobile station, and if so, initiates activation of the transmit path components for ensuing traffic mode operation. In the traffic mode, receive signals are likewise decoded by Viterbi decoder 220 and outputted to processor 222, which separates decoded overhead data from audio data. The audio data is supplied to digital to analog (D/A) converter 228 for conversion to an analog signal which is output to a speaker.

In the transmit path, an analog input signal is digitized by A/D converter 228, and then Walsh and long code modulated within modulator 230. The modulator 230 output signal is spread with a pseudonoise sequence and converted to an analog signal by CDMA spreader and D/A converter 231. RF modulator 232 phase modulates the analog output signal of spreader/converter 231. Frequency synthesizer 217 supplies a synthesized frequency to RF modulator 232 to be modulated (or up-converted and then modulated). The modulated output is amplified by RF power amplifier 234 and routed through duplexer 212 as a reverse transmit signal $S_T$.

Figure 3:
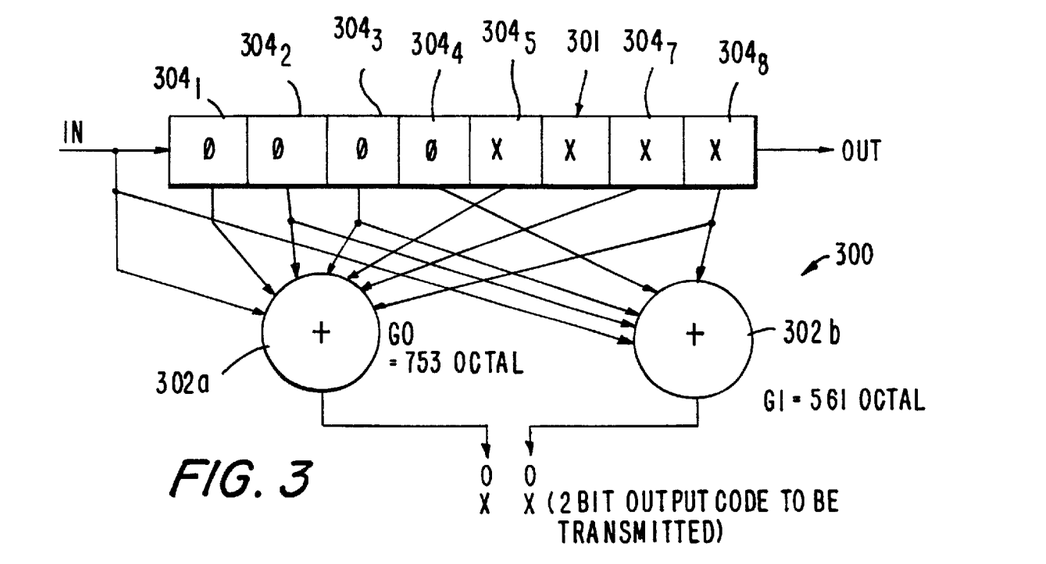
FIG. 3 schematically illustrates a base station encoder.

With reference now to FIG. 3, an illustrative base station encoder 300 is schematically shown, which is merely an example to illustrate the principles of the invention. It is understood that the present invention may be practiced in conjunction with many alternative encoder configurations. Encoder 300 includes an 8-bit shift register 301 for receiving and temporarily storing original data to be coded. The register is suitably connected to a pair of modulo-2 adders 302a and 302b, with generating polynomials of G0=753 octal and G1=561 octal, respectively. These polynomial values correspond to those of the IS-95 standard. Adder 302a modulo-2 adds the incoming bit with bits from stages $304_1$, $304_2$, $304_3$, $304_5$, $304_7$ and the last stage $304_8$ of register 301 to generate a first bit of a convolutionally encoded output code. Adder 302b modulo-2 adds the incoming bit and bits from stage $304_2$, $304_3$, $304_4$, and the last stage $304_8$ of register 301 to generate the second bit of the encoded output code. Each time a new original data bit is shifted into register 301, two bits are outputted from the encoder to be modulated and spread with a pseudonoise sequence for transmission to a mobile station.

It will be assumed for illustrative purposes in the following discussion that the number $N_B$ of padding bits PB is four and that these padding bits are all zeroes. With this assumption, the contents of register 301 are shown in FIG. 3 at a time $t_0$ immediately prior to the placement of an SCI bit into the original data stream. Thus, the contents of register stages $304_1$, to $304_4$ are all zeroes while the contents of stages $304_5$–$304_8$ are unknown (represented as an "X"), i.e., unknown to the mobile station decoder. These bit values are unknown because mobile station 210, when operating in the slotted mode, wakes up immediately prior to the transmission of the encoded SCI bit.

Figure 4:
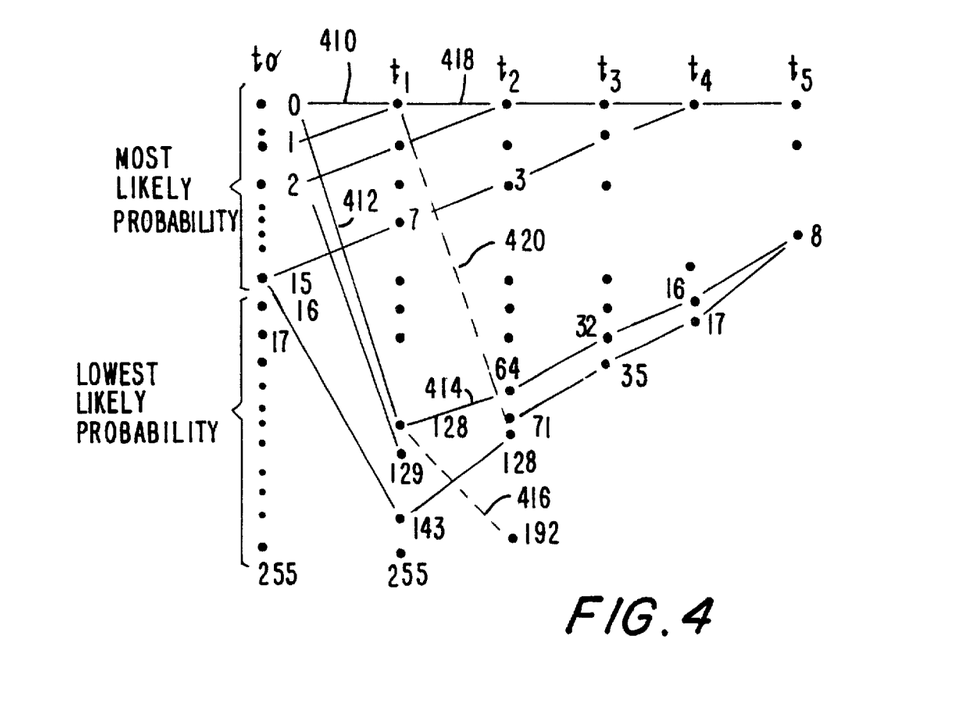
FIG. 4 is a trellis diagram depicting operation of an illustrative Viterbi decoder in accordance with the invention.

FIG. 4 is a portion of a trellis diagram depicting path memories in the operation of the illustrative Viterbi decoder 220 in accordance with the invention, with an assumption of an 8-bit encoder register and four padding bits PB as just described in conjunction with FIG. 3. In contrast to a conventional decoder designed to decode a convolutionally encoded message from an unknown state, Viterbi decoder 220 assigns a most likelihood probability to predetermined initial encoder states, and calculates trellis path memories accordingly. As a result, the trellis converges within a short time interval. Contrarily, prior art decoders decoding from an unknown initial encoder state assign equal probability to all possible initial encoder states, thereby requiring a substantial amount of time for the decoder to converge.

As known to those skilled in the art, a trellis diagram corresponding to operation of a Viterbi decoder illustrates the different possible data sequences outputted by a convolutional encoder. Each path of the trellis diagram represents a different data sequence, with the paths being drawn between different encoder states. Normally, there are $2^{K-1}$ possible encoder states for a code length of K, or $2^8$=256 possible states for a K=9 convolutional code. For instance, as shown in FIG. 4, it is possible for the unknown encoder state at time $t_0$ to be 00000000 (state 0). When the next original data bit is shifted into register 301 at time $t_1$, if the bit is a "1", the state will change to 10000000 (state 128 decimal). As such, trellis line 412 is drawn from state 0 at time $t_0$ to state 128 at time $t_1$, to represent that possible case. The two bit output code of the encoder for this case would be 11 due to the modulo-addition of adders 302a, 302b (for the polynomials of FIG. 3). If, on the other hand, the bit shifted in at time $t_1$ is a "0", the encoder state would remain at state 0, whereby trellis line 410 is drawn as shown. For this case, the two bit encoder output code at time $t_1$, would be 00. Likewise, trellis line 416 represents the case of the original data bits at times $t_1$, and $t_2$ both being ones, which would produce an encoder output code of 01 at time $t_2$. Trellis line 414 represents the case of the bit at time $t_1$, being 1 and the bit at time $t_2$ being 0, which would yield an encoder output code of 10 at time $t_2$. Similarly, if the bit at time $t_1$ is 0, trellis lines 418 and 420 are drawn to correspond to the cases of the bit at time $t_2$ being 0 and 1, respectively. Accordingly, trellis paths are computed and stored in memory within the Viterbi decoder. Thus, for example, the survivor path combination of lines 412 and 414 would be stored in a memory table as 10 corresponding to the original data sequence it represents. The combination of paths 412 and 416 would be stored to correspond to the original bit sequence of 01. The process continues until the bit sequences and associated original data of all possible paths of a predetermined length are initially stored in the decoder memory.

In operation of a conventional Viterbi decoder, the received data sequence is compared to the sequences of the various path memories. Paths are then eliminated based on the likelihood of the received data to the respective paths, until the decoder converges and only one path survives. This elimination process is known as maximum likelihood estimation. The surviving path corresponds to the most likely transmitted data sequence. Most errors between the transmitted encoded data and the received data will be corrected with this process.

Naturally, if the decoding process begins with the encoder in an unknown state, the larger the number of possible initial encoder states, and the longer it will take for the decoder to converge. For instance, in the prior art approach discussed above, in which the decoder is turned on approximately one frame (20 ms) ahead of time to synchronize, the decoder, when turned on, assumes that the encoder can be in any one of 256 states of equal likelihood.

With the Viterbi decoder of the present embodiment, rather than beginning the decoding procedure by assuming all 256 possible states and defining all possible trellis paths from those states, the decoder assigns a relatively small number of initial encoder states of most likelihood probability, and the least likely probability to all other states. As a consequence, the trellis is able to converge within a short time interval. In the example of FIGS. 3 and 4, encoder states 0 to 15 are assigned a maximum likely probability, while states 16 to 255 are assigned a lowest likely probability. The trellis is then "drawn" from states 0 to 15 at time $t_0$. With this approach, all possible paths through the trellis will converge with the most likely path at time $t_5$. Since convergence occurs within five transitions, which is less than the minimum free distance of the code, error-free decoding is achieved provided that no consecutive bit errors are present between the transmitted and received data.

The Viterbi decoder states of maximum likelihood, i.e., states 0 to 15 corresponding to binary codes 00000000 to 00001111, respectively, are established based on knowledge of the precise number of padding bits (and their values) inserted immediately prior to the SCI bit and the synchronized message. For instance, if five zeroes were always inserted prior to the SCI bit, the decoder would assign initial encoder states 0 to 7, whereas if only three consecutive zeroes were inserted, initial encoder states 0 to 31 would be assigned. The smaller the number of known padding bits employed, however, the longer it takes for the Viterbi decoder to converge. Preferably, the states are selected such that convergence occurs within the minimum free distance of the code to guarantee error-free decoding as just mentioned.

Figure 5:
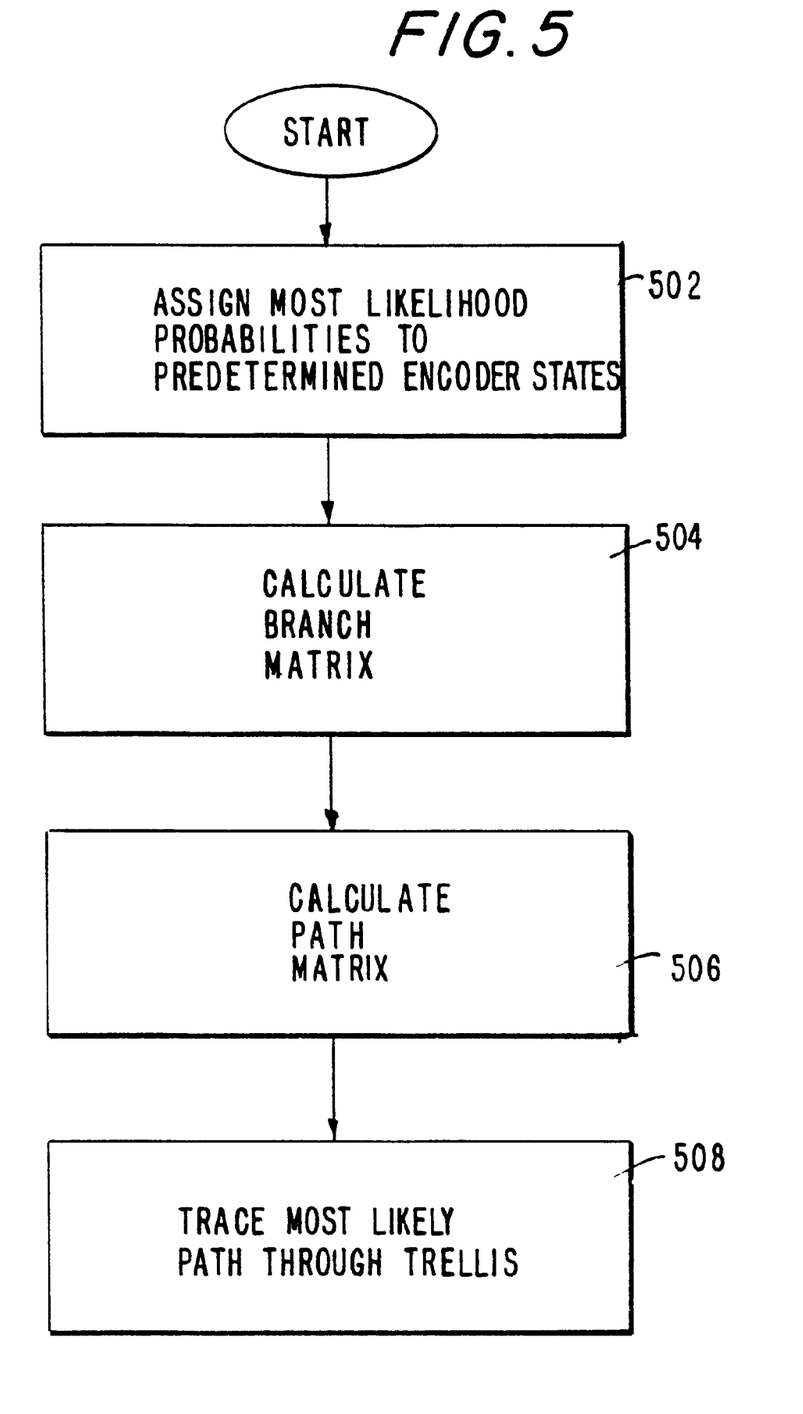
FIG. 5 is a flow chart illustrating a routine within a Viterbi decoder in accordance with the invention.

With reference now to FIG. 5, a flow chart illustrating a routine running within Viterbi decoder 220 is depicted. When the decoder is turned on, it assigns most likelihood probabilities to predetermined encoder states (step 502) in accordance with the protocol of the communication system, i.e., in accordance with the number and values of the padding bits and the number of encoder register stages. The remaining decoding process may then be performed in a manner well known to those skilled in the art. Steps 504 to 508 depict a typical decoding process in accordance with the Viterbi algorithm. In step 504, a Branch Matrix (transitional probability) is calculated. The Branch Matrix is defined as the square of the difference between the received symbol code and the optimum code value. Next, in step 506, a Path Matrix (joint probability) is calculated by determining the Euclidean distance between the most likely path (sequence) and all other paths (sequences). This distance is computed by adding and subtracting the Branch Matrix from the state transitions leading to the current state and updating the current state Path Matrix. As the Path Matrix is computed, the binary decision (survivor bit) for each of the $2^{K-1}$ possible states is stored in a survivor path memory.

The Viterbi decoder then traces the most likely path through the trellis by tracing back the survivor path memory starting with the most likely state (step 508). When the depth of the survivor path is long enough to guarantee that the "all state" trellis merges with the most likely path, the effects of channel noise are mitigated as the paths through the trellis converge. The bits selected through the trace back operation are the maximum likely estimation of the originally transmitted bit sequence.

Figure 6:
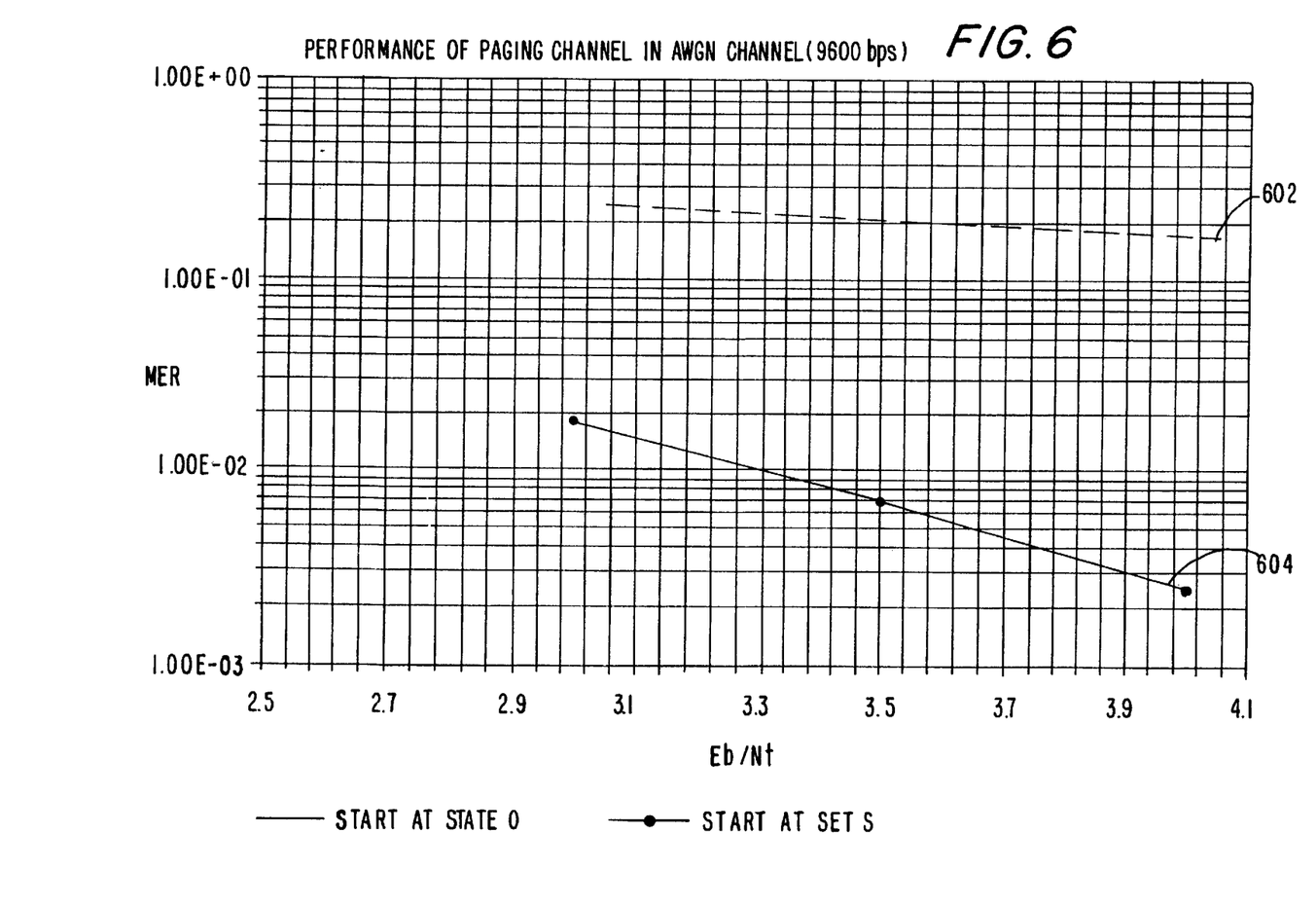
FIG. 6 is a graph illustrating simulated performance of an embodiment of the invention.

FIG. 6 is a graph showing simulated performance results of the message error rate (MER) as a function of signal to noise ratio (Eb/Nt) for an embodiment of a mobile station decoder in accordance with the invention. The simulated decoder receives pages in the slotted mode with four padding bits prior to the message as described above in connection with FIGS. 3–5. Operation in an Additive White Gaussian Noise (AWGN) channel at a data rate of 9600 bps is simulated. Curve 602 represents performance of the decoder initialized to start decoding from an unknown state (equal likelihood for all encoder states). Curve 604 represents the performance of the decoder in accordance with the invention.

While the present invention has been particularly shown and described in conjunction with preferred embodiments thereof, it will be readily appreciated by those of ordinary skill in the art that various changes and modifications may be made to the disclosed embodiments without departing from the spirit and scope of the invention. For example, although the preferred embodiment has been described for use in a CDMA communication system, the invention may also be used for the encoding and decoding of messages in time domain multiplexed (TDM) and frequency division multiplexed (FDM) wireless telecommunication systems as well as in wireline systems. Also, the convolutionally encoded messages to be decoded in accordance with the invention may be short communication messages rather than strictly paging messages. Further, different encoder configurations may be employed as a function of the application, and the number of encoder states initially assigned the most likely probability for a given encoder configuration can be modified to achieve specific objectives. As yet another example, another type of convolutional decoder such as a tree decoder may be substituted for the Viterbi decoder to decode the messages. Accordingly, all such changes and modifications are intended to be included within the scope of the invention as defined by the appended claims.

What is claimed is:

1. In a communications system employing a communication channel in which a message is convolutionally encoded by an encoder and transmitted to a remote terminal during a time slot allocated to at least that remote terminal, without completely resetting the encoder immediately prior to said allocated time slot such that said encoder is in an unknown state at the onset thereof, a method for decoding said message at the remote terminal, comprising:

assigning a most likelihood probability for an initial encoder state to plural predetermined encoder states; and convolutionally decoding ensuing bits of said message based on an assumption of said initial encoder state being any one of said predetermined states.

2. The method of claim 1 wherein said predetermined encoder states are a function of a known number of consecutive padding bits of a known value convolutionally encoded and transmitted by the base station prior to said allocated time slot.

3. The method of claim 2 wherein said padding bits are transmitted immediately prior to a bit stream of said message.

4. The method of claim 3 wherein said consecutive padding bits comprise four consecutive bits, said encoder has 256 possible states, and said predetermined encoder states comprise 16 states of said 256 states.

5. The method of claim 4 wherein said four consecutive bits are all zeroes, and said predetermined encoder states comprise the first sixteen states of said 256 states.

6. The method of claim 1 wherein said step of convolutionally decoding is performed by a Viterbi decoder that defines trellis paths drawn from each of said predetermined encoder states having a most likelihood probability and eliminates paths based on the likelihood of received data to the respective paths, to thereby arrive at a surviving path corresponding to the most likely transmitted data sequence.

7. The method of claim 1 wherein said communications system is a wireless telecommunications system.

8. The method of claim 1 wherein said communication channel is a paging channel of a wireless telecommunications system.

9. The method of claim 8 wherein said telecommunications system is a code division multiple access (CDMA) system.

10. The method of claim 1 wherein said message is a page message indicative of an incoming call notification for the remote terminal.

11. The method of claim 1 wherein said predetermined encoder states are selected such that a decoder performing said convolutional decoding converges within a number of transitions less than a minimum free distance of a code stored within a register of said encoder.

12. The method of claim 1, further comprising the steps of periodically supplying power to receiver electronics of said remote terminal immediately prior to said allocated time slot, and turning off power to said receiver electronics when no message intended for the remote terminal is received within said time slot.

13. A decoder for decoding a convolutionally encoded message transmitted in a particular time slot of a communication channel, said message having been encoded by an encoder in an unknown state immediately prior to the onset of said particular time slot, said decoder comprising:

circuitry for assigning a most likelihood probability for an initial encoder state to plural predetermined states; and decoding circuitry operable to decode ensuing bits of said message based on an assumption of said initial encoder state being any one of said predetermined encoder states.

14. The decoder of claim 13 wherein said decoding circuitry employs a Viterbi algorithm to decode said message by defining trellis paths drawn from each of said predetermined encoder states having a most likelihood probability and eliminating paths based on the likelihood of received data to the respective paths, to thereby arrive at a surviving path corresponding to the most likely transmitted data sequence.

15. The decoder of claim 13 wherein said predetermined encoder states are selected such that the decoder converges within a number of transitions less than a minimum free distance of a code stored within a register of said encoder.

16. A mobile station, comprising:

a decoder for decoding a convolutionally encoded message transmitted in a particular time slot of a communication channel, said message having been encoded by a base station encoder in an unknown state immediately prior to the onset of said particular time slot, said decoder comprising:

circuitry for assigning a most likelihood probability for an initial encoder state to plural predetermined states, and convolutional decoding circuitry operable to decode ensuing bits of said message based on an assumption of said initial encoder state being any one of said predetermined states.

17. The mobile station of claim 16 wherein said decoder comprises a Viterbi decoder that defines trellis paths drawn from each of said predetermined encoder states having a most likelihood probability and eliminates paths based on the likelihood of received data to the respective paths, to thereby arrive at a surviving path corresponding to the most likely transmitted data sequence.

18. The mobile station of claim 16 wherein said predetermined encoder states are selected such that the decoder converges within a number of transitions less than a minimum free distance of a code stored within a register of said encoder.

19. In a wireless communications system including a base station operable to transmit a convolutionally encoded message outputted by an encoder to a remote terminal in a communication channel during a periodic time slot allocated to at least that remote terminal, without completely resetting the encoder prior to the allocated time slot such that the encoder is in an unknown state at the onset thereof, a method of performing error correction of the message comprising the steps of:

convolutionally encoding and transmitting a predetermined number of padding bits prior to the start of said allocated time slot;

assigning a most likelihood probability for an initial encoder state to plural predetermined encoder states in accordance with the predetermined number of padding bits; and convolutionally decoding ensuing bits of said message based on an assumption of said initial encoder state being any one of said predetermined states.

20. The method of claim 19 wherein said decoding is performed with a Viterbi decoder that defines trellis paths drawn from each of said predetermined encoder states having a most likelihood probability and eliminates paths based on the likelihood of received data to the respective paths, to thereby arrive at a surviving path corresponding to the most likely transmitted data sequence, and wherein said predetermined number of padding bits are encoded and transmitted immediately prior to the onset of said allocated time slot, and the predetermined states are assigned such that the decoder converges within a number of transitions less than a minimum free distance of a code stored within a register of said encoder.

* * * * *